US010116120B2

(12) United States Patent
Takeuchi et al.

(10) Patent No.: US 10,116,120 B2
(45) Date of Patent: Oct. 30, 2018

(54) SEMICONDUCTOR MULTILAYER FILM MIRROR, VERTICAL CAVITY TYPE LIGHT-EMITTING ELEMENT USING THE MIRROR, AND METHODS FOR MANUFACTURING THE MIRROR AND THE ELEMENT

(71) Applicants: MEIJO UNIVERSITY, Nagoya-shi, Aichi (JP); STANLEY ELECTRIC CO., LTD., Meguro-ku, Tokyo (JP)

(72) Inventors: Tetsuya Takeuchi, Nagoya (JP); Isamu Akasaki, Nagoya (JP); Shinichi Tanaka, Kanagawa (JP); Kazufumi Tanaka, Akishima (JP)

(73) Assignees: STANLEY ELECTRIC CO., LTD., Tokyo (JP); MEIJO UNIVERSITY, Nagoya-shi, Aichi (JP)

( * ) Notice: Subject to any disclaimer, the term of this patent is extended or adjusted under 35 U.S.C. 154(b) by 0 days.

(21) Appl. No.: 15/836,776

(22) Filed: Dec. 8, 2017

(65) Prior Publication Data

US 2018/0166856 A1  Jun. 14, 2018

(30) Foreign Application Priority Data

Dec. 13, 2016  (JP) ................................. 2016-241159

(51) Int. Cl.
*H01S 5/18* (2006.01)
*H01S 5/183* (2006.01)
(Continued)

(52) U.S. Cl.
CPC .......... *H01S 5/18377* (2013.01); *H01S 5/028* (2013.01); *H01S 5/187* (2013.01);
(Continued)

(58) Field of Classification Search
CPC .. H01S 5/18377; H01S 5/028; H01S 5/18347; H01S 5/187; H01S 5/32341;
(Continued)

(56) References Cited

U.S. PATENT DOCUMENTS

| 6,408,015 B1 | 6/2002 | Kaneko |
| 2007/0003697 A1 | 1/2007 | Carlin et al. |
| 2008/0056320 A1 | 3/2008 | Takeuchi |

FOREIGN PATENT DOCUMENTS

| JP | H07297476 A | 11/1995 |
| JP | 2000091701 A | 3/2000 |

OTHER PUBLICATIONS

Extended European Search Report (EESR) dated Apr. 17, 2018 issued in counterpart European Application No. 17206524.5.
(Continued)

*Primary Examiner* — Armando Rodriguez
(74) *Attorney, Agent, or Firm* — Holtz, Holts & Volek PC

(57) ABSTRACT

A semiconductor multilayer film mirror is configured such that a pair of an InAlN-based semiconductor film and a GaN-based semiconductor film is layered a plurality of times in a cyclic fashion and the InAlN-based semiconductor film has an In composition of less than 18 at %. The semiconductor multilayer film mirror includes a thin GaN cap layer formed on the InAlN-based semiconductor film and an AlGaN layer formed on the thin GaN cap layer between each pair of the InAlN-based semiconductor film and the GaN-based semiconductor film.

14 Claims, 12 Drawing Sheets

(51) Int. Cl.
 *H01S 5/028* (2006.01)
 *H01S 5/323* (2006.01)
 *H01S 5/343* (2006.01)
 *H01S 5/187* (2006.01)

(52) U.S. Cl.
 CPC ...... *H01S 5/18347* (2013.01); *H01S 5/32341* (2013.01); *H01S 5/343* (2013.01); *H01S 2304/04* (2013.01)

(58) Field of Classification Search
 CPC . H01S 5/343; H01S 5/18; H01S 5/183; H01S 2304/04
 See application file for complete search history.

(56) References Cited

OTHER PUBLICATIONS

Z. Gacevic et al., "Growth and characterization of lattice-matched InAlN/GaN Bragg reflectors grown by plasma-assisted molecular beam epitaxy," Phys. Status Sohdi C, 2009, pp. 1-3.

Fig. 12

| | DISLOCATION DENSITY (NUMBER/cm2) | JUDGEMENT | FLATNESS (Zp-p@AFM100μm□) (nm) | JUDGEMENT | OVERALL EVALUATION |
|---|---|---|---|---|---|
| COMPARATIVE EXAMPLE 1 | 3.10E+7 | D | 8.9 | D | D |
| EXAMPLE 1 | 2.00E+6 | A | 5.3 | C | B |
| EXAMPLE 2 | 5.00E+6 | B | 3.6 | A | B |
| EXAMPLE 3 | 5.00E+6 | B | 3.6 | A | B |
| EXAMPLE 4 | 3.00E+6 | A | 3.7 | A | A |
| EXAMPLE 5 | 3.00E+6 | A | 1.6 | A | A |

SEMICONDUCTOR MULTILAYER FILM MIRROR, VERTICAL CAVITY TYPE LIGHT-EMITTING ELEMENT USING THE MIRROR, AND METHODS FOR MANUFACTURING THE MIRROR AND THE ELEMENT

BACKGROUND OF THE INVENTION

1. Field of the Invention

The present invention relates to a semiconductor light-emitting element, and more particularly, to a semiconductor multilayer film mirror, a vertical cavity type light-emitting element using the semiconductor multilayer film mirror, and methods for manufacturing the semiconductor multilayer film mirror and the vertical cavity type light-emitting element.

2. Description of the Related Art

In a light-emitting diode (hereinafter referred to as LED) or a laser diode (hereinafter referred to as LD), which is a semiconductor light-emitting element, white light emitted from such a light-emitting element, in particular, has been drawing attention, such as pseudo white light produced by exciting yellow phosphor by blue or purple light, or white light produced by RGB color mixing. In gallium nitride (hereinafter referred to as GaN)-based LEDs, blue light-emitting elements prevail, and a wide range of emission wavelengths from yellow (long wavelength) to purple (short wavelength) can be obtained by changing a mixed crystal ratio between indium (hereinafter referred to as In) and Ga in their light-emitting layers. In LDs, researches have been made on laser oscillation in a green or even longer wavelength region using GaN substrates having various plane orientations as growth substrates (hereinafter referred to as substrates or wafers).

In a vertical cavity surface emitting laser (hereinafter referred to as a VCSEL), distributed Bragg reflectors (hereinafter referred to as DBRs) having different reflectivities are used as cavity mirrors on its back surface side and its exit surface side. While dielectric multilayer film mirrors formed from a plurality of dielectric thin films can be used as DBRs, using a DBR formed from a plurality of semiconductor thin films, i.e., a semiconductor multilayer film mirror as one of the DBRs has advantages such that the semiconductor DBR and epitaxial layers can be produced continuously (see Growth and characterization of lattice matched InAlN/GaN Bragg reflectors grown by plasma-assisted molecular beam epitaxy (Phys. Status Sohdi C, 1-3 (2009), Z Gacevic et al. (hereinafter referred to as Non-Patent Literature 1) and Japanese Patent Application Laid-open No. 2000-91701 (hereinafter referred to as Patent Literature 1)).

SUMMARY OF THE INVENTION

InAlN-based semiconductor layers are often used in semiconductor DBRs. Many of general semiconductor DBRs are produced by low pressure chemical vapor deposition (LP-CVD) under reduced pressure of several thousand pascals or less. In such LP-CVD, pumps for evacuating air and controlling to obtain a predetermined reduced pressure value are additionally required, thus leading to increase in manufacturing costs. In many of (In)AlN-based crystals, many high-quality crystals can be obtained by low pressure growth. When (In)AlN-based crystals are grown under atmospheric pressure, however, problems arise such as deteriorated flatness or an increased dislocation density in DBRs.

Non-Patent Literature 1 describes the growth of an InAlN/GaN DBR by metal-organic vapor phase epitaxy (hereinafter referred to as MOVPE) under reduced pressure and molecular beam epitaxy (hereinafter referred to as MBE), and the analysis and evaluation thereof. In the method of Non-Patent Literature 1, a generally-known InAlN layer having In composition of 18 at % (atomic composition ratio) to be lattice-matched with a GaN layer is grown. A template obtained by growing a GaN layer on C-plane sapphire by the MOVPE is used as a substrate.

Patent Literature 1 describes a method for manufacturing an AlN/GaN DBR in which AlN as a low-refractive index layer and GaN as a high-refractive index layer are repeatedly layered on a sapphire substrate by the MOVPE under reduced pressure. The method of Patent Literature 1 aims at increasing reflectivity and reducing the number of lattice defects.

In the method described in Non-Patent Literature 1, the InAlN layer has In composition of 18 at %, i.e., the InAlN layer can be lattice-matched with the GaN layer, thus causing no cracks. Non-Patent Literature 1, however, describes that its reflectivity is lower than simulated reflectivity. The reason for this can be considered as follows. When the InAlN layer has high In composition, the surface state thereof may be deteriorated and the interfacial state between the InAlN layer and the GaN layer may be thus roughened depending on growth environments such as a growth apparatus, a method, and conditions. This increases the absorption of light, and the reflectivity is thereby reduced. This can be seen also from the TEM image described in Non-Patent Literature 1.

The AlN/GaN DBR described in Patent Literature 1 is effective in terms of increasing a refractive index difference between AlN and GaN. Such a DBR, however, increases a lattice mismatch rate between the AlN layer and the GaN layer (a ratio of a difference between a (=b)-axis length of the GaN layer and an a (=b)-axis length of the AlN layer to an axis length on the substrate side). Thus, it is easily conceivable that many cracks are generated to such an extent chat the DBR cannot be practically used. In a DBR for a longer wavelength region than blue, in particular, the thicknesses of layers in the DBR need to be increased as compared to a DBR for a UV region, for example. Thus, the DBR for a longer wavelength region generates more cracks. When many cracks are generated, the reflectivity of the semiconductor DBR is reduced to a level unbearable for practical use.

The lattice mismatch can be a cause not only for cracks but also for the occurrence of dislocation. If dislocation occurs, the dislocation reaches a light-emitting layer to be a non-radiation recombination center, thus lowering luminous efficiency.

Moreover, the lattice mismatch can be a cause for a deteriorated surface state. Such a deteriorated surface state reduces the reflectivity of a dielectric DBR deposited when a VCSEL is produced, increases oscillation threshold current and decreases output, and significantly degrades the device characteristics.

The present invention has been made in view of the aforementioned problems. It is an object of the present invention to provide a semiconductor multilayer film mirror capable of improving the flatness or crystallizability of a surface of a semiconductor layer to obtain a high reflectivity, and having a low dislocation density, and a method for manufacturing such a semiconductor multilayer film mirror. Another object of the present invention is to provide a vertical cavity type light-emitting element having high output and high reliability and a method for manufacturing such a vertical cavity type light-emitting element.

A semiconductor multilayer film mirror according to one aspect of the present invention is a semiconductor multilayer film mirror comprising:

a plurality of pairs of an InAlN-based semiconductor films and a GaN-based semiconductor film, where each pair of the InAlN-based semiconductor film and the GaN-based semiconductor film is layered in a cyclic fashion, the InAlN-based semiconductor film having an In composition of less than 18 at %; and a thin GaN cap layer formed on the InAlN-based semiconductor film, and an AlGaN layer formed on the thin GaN cap layer, between each pair of the InAlN-based semiconductor film and the GaN-based semiconductor film.

A vertical cavity type light-emitting element according to another aspect of the present invention comprises:

the foregoing semiconductor multilayer film mirror as a first reflecting mirror;

a first semiconductor layer formed of at least one semiconductor layer on the first reflecting mirror;

an active layer formed on the first semiconductor layer;

a second semiconductor layer formed on the active layer and including at least one semiconductor layer having a conductivity type opposite to that of the first semiconductor layer; and a second reflecting mirror disposed on the second semiconductor layer so as to be opposed to the first reflecting mirror.

According to still another aspect of the present invention, a method for manufacturing a semiconductor multilayer film mirror by atmospheric pressure metal-organic vapor phase epitaxy comprises: a layering step of layering a pair of an InAlN-based semiconductor film and a GaN-based semiconductor film a plurality of times in a cyclic fashion. The layering step includes: a step of growing the InAlN-based semiconductor film so that the InAlN-based semiconductor film has an In composition of less than 18 at %; a step of forming a thin GaN cap layer after the growth of the InAlN-based semiconductor film; a step of growing an AlGaN layer after the growth of the thin GaN cap layer; and a step of growing the GaN-based semiconductor film after the growth of the AlGaN layer.

According to still another aspect of the present invention, a method for manufacturing a vertical cavity type light-emitting element by atmospheric pressure metal-organic vapor phase epitaxy includes: a step of forming a semiconductor multilayer film mirror obtained according to the foregoing method for manufacturing a semiconductor multilayer film mirror as a first reflecting mirror; a step of forming a first semiconductor layer formed of at least one semiconductor layer on the first reflecting mirror; a step of forming an active layer on the first semiconductor layer; a step of forming a second semiconductor layer, including at least one semiconductor layer having a conductivity type opposite to that of the first semiconductor layer, on the active layer; and a step of forming a second reflecting mirror on the second semiconductor layer so as to be opposed to the semiconductor multilayer film mirror.

According to the semiconductor multilayer film mirror of the present invention, the dislocation defect density and flatness of the surface after the growth are significantly improved. Accordingly, the dislocation density and surface flatness of the light-emitting layer grown on the semiconductor multilayer film mirror are good too. Consequently, a vertical cavity type light-emitting element having stabilized oscillation, a good yield, and a high oscillation probability can be provided. Moreover, the In composition of the InAlN layer is set to be less than lattice match composition with GaN. Consequently, it is possible to provide a semiconductor multilayer film mirror having an increased refractive index difference between the InAlN layer and the GaN layer, having increased reflection band or a reduced number of layered pairs, and achieving improved quality and reduced growth costs as compared to the conventional techniques.

BRIEF DESCRIPTION OF THE DRAWINGS

FIG. 3 is a partial cross-sectional view of the grown wafer illustrating a process step of the semiconductor light-emitting element according to Example 1 of the present invention;

FIG. 12 is a table showing results of dislocation densities and surface flatness regarding the Al composition of an AlGaN layer interposed between first and second GaN layers in semiconductor multilayer film mirrors obtained by process steps of semiconductor light-emitting elements in Examples of the present invention and Comparative Example.

DETAILED DESCRIPTION OF THE INVENTION

Figure 1:
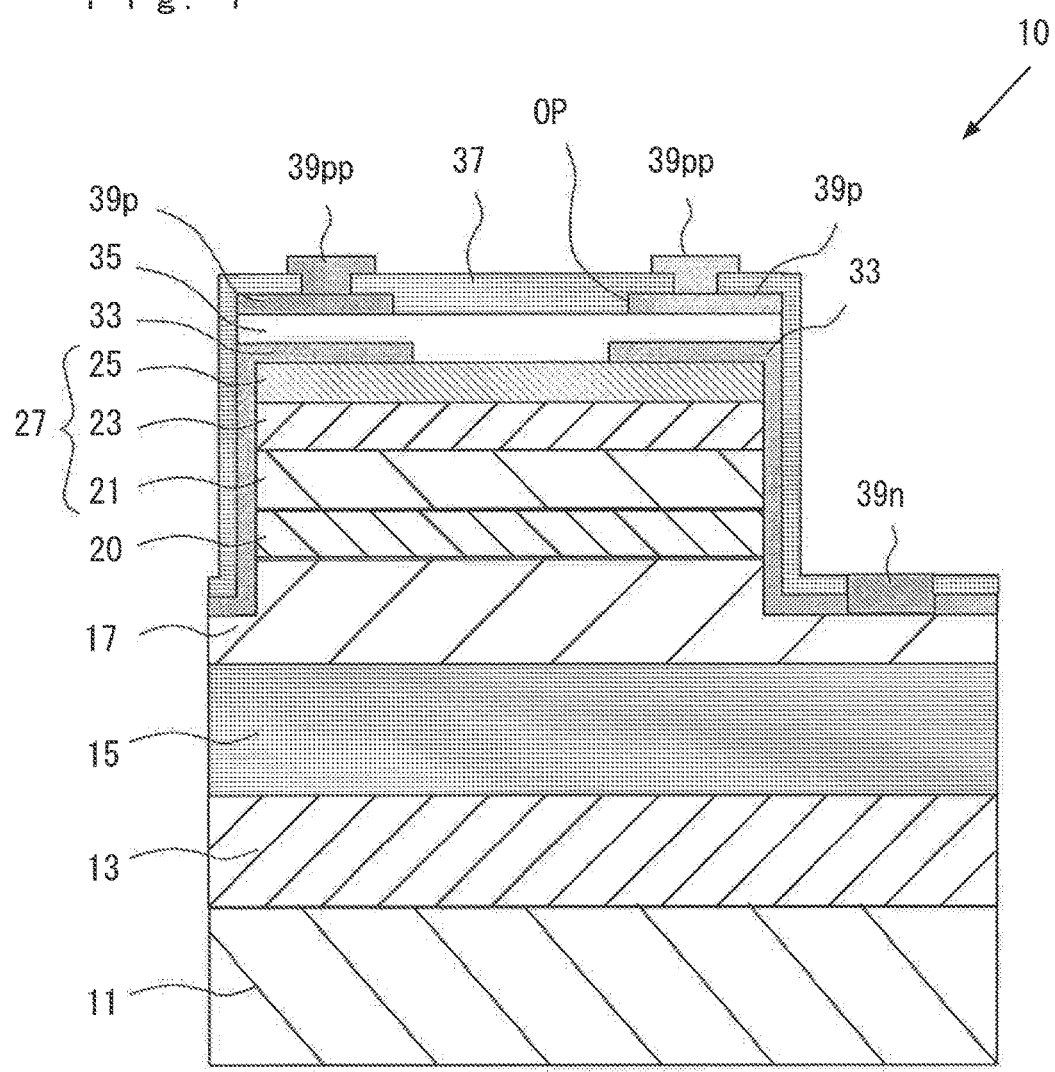
FIG. 1 is a cross-sectional view schematically illustrating a layered structure of a VCSEL element according to Example 1 of the present invention.

Examples according to the present invention will now be described below with reference to the drawings. Note that the present invention is not limited to the following Examples. In those Examples, components having substantially the same function and configuration will be denoted by the same reference numerals, and redundant description will be omitted.

Example 1

Figure 2:
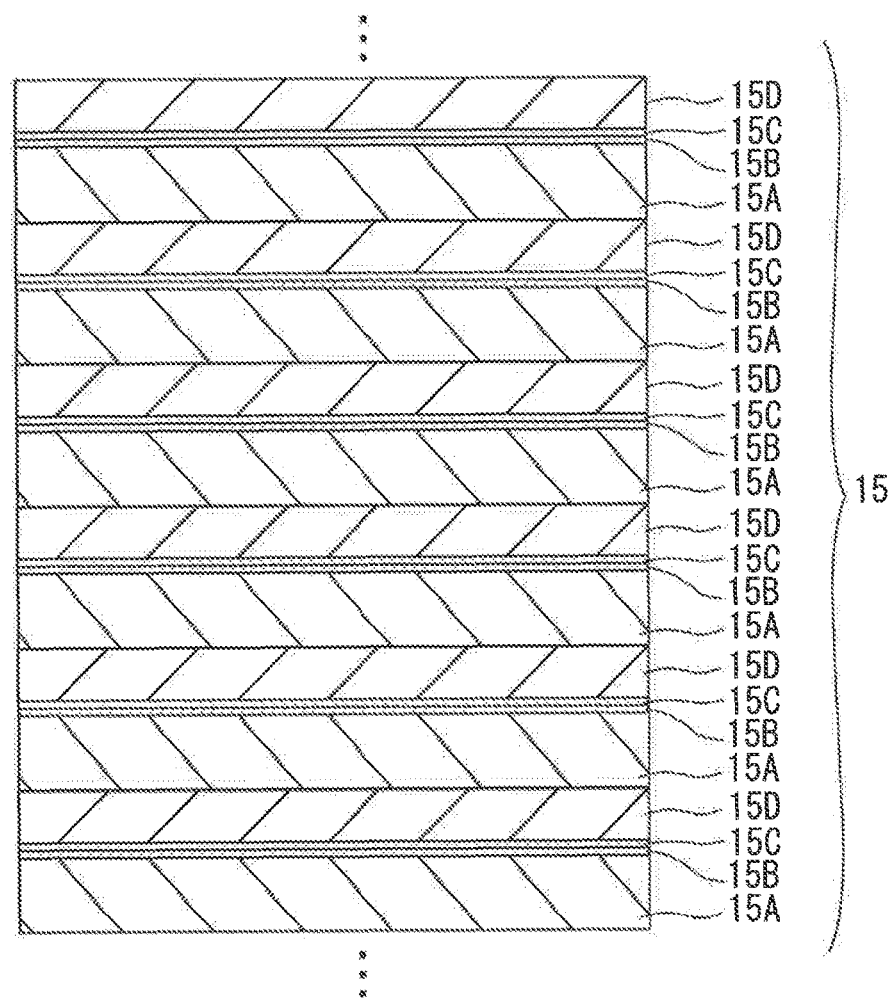
FIG. 2 is a cross-sectional view schematically illustrating a layered structure of a semiconductor multilayer film mirror in the VCSEL element according to Example 1 of the present invention.

FIG. 1 is a cross-sectional view schematically illustrating a layered structure of a VCSEL element 10, which is a vertical cavity type light-emitting element of Example 1. FIG. 2 is a diagram illustrating a cross-sectional structure of a semiconductor multilayer film mirror 15 in the VCSEL element 10.

As shown in FIG. 1, an underlayer 13 formed from undoped GaN is provided on a substrate 11.

The semiconductor multilayer film mirror 15 (first reflecting mirror) is formed on the underlayer 13. A first semiconductor layer 17 having a first conductivity type (n-type) and a light-emitting layer 20 are sequentially formed on the semiconductor multilayer film mirror 15.

A p-type AlGaN layer 21, a p-type GaN layer 23, and a p-type GaN contact layer 25 are formed in this order on the light-emitting layer 20. The p-type AlGaN layer 21, the p-type GaN layer 23, and the p-type GaN contact layer 25, each having a second conductivity type (p-type) opposite to the first conductivity type, are collectively referred to as a second semiconductor layer 27.

As shown in FIG. 1, the VCSEL 10 is configured in such a manner that an insulating film 33 having an opening OP (light-passing aperture) with a predetermined diameter, a transparent electrode 35 electrically connected to the second semiconductor layer 27 via the opening OP, and a dielectric multilayer film mirror 37 (second reflecting mirror) are formed in this order on the second semiconductor layer 27. Moreover, a p-electrode 39p electrically connected to the transparent electrode 35 is provided on the transparent electrode 35. Furthermore, the VCSEL 10 is provided with an n-electrode 39n electrically connected to the first semiconductor layer 17.

As shown in FIG. 2, the semiconductor multilayer film mirror 15, which is a semiconductor DBR, has a structure in which a pair of an InAlN-based semiconductor film 15A and a GaN-based semiconductor film 15D is layered a plurality of times in a cyclic fashion with a thin GaN cap layer 15B formed on the InAlN-based semiconductor film 15A and an AlGaN layer 15C formed on the thin GaN cap layer 15B interposed therebetween. The thin GaN cap layer 15B and the AlGaN layer 15C each have a thickness smaller than those of the InAlN-based semiconductor film 15A and the GaN-based semiconductor film 15D. Specifically, a set of the InAlN-based semiconductor film 15A, the thin GaN cap layer 15B, the AlGaN layer 15C, and the GaN-based semiconductor film 15D is layered a plurality of times in a cyclic fashion to form the semiconductor multilayer film mirror 15. That is, the semiconductor multilayer film mirror 15 has reflection characteristics such that the emission wavelength of the light-emitting layer 20 corresponds to a reflection center wavelength.

A GaN-based semiconductor light-emitting element, such as a VCSEL element, employs an InGaN-based semiconductor layer as a well layer of a blue light-emitting layer. Such an InGaN-based semiconductor layer has advantages such as (1) a reduced dislocation density, (2) enhanced capturing of In, and (3) reduced capturing of carbon to be inhibition impurities when grown under atmospheric pressure (about 1013.25 hPa) in atmospheric pressure chemical vapor deposition (AP-CVD).

In view of this, an example of a procedure of growing layers of a VCSEL element by means of atmospheric pressure metal organic chemical vapor deposition (AP-MOCVD) in which the layers are grown under atmospheric pressure (around 101325 Pa), and a step of producing the VCSEL elements will now be described below. In this example, the oscillation wavelength is 445 nm, and the length of the cavity is set to four times the oscillation wavelength. If the emission wavelength is varied, then the total thickness of the layers is changed. Moreover, the length of the cavity can be designed freely. The length of the cavity can be any integral multiple of the oscillation wavelength without being limited to four times the oscillation wavelength.

(Step G1: Underlayer)

A C-plane GaN substrate was used as the substrate 11. Alternatively, C-plane sapphire, A-plane sapphire, R-plane sapphire, semipolar-plane GaN, nonpolar-plane GaN, AlN, ZnO, $Ga_2O_3$, GaAs, Si, SiC, spinel ($MgAl_2O_4$), or the like may be used as the substrate. When a substrate other than the GaN substrate, e.g., a sapphire substrate, is used, it is preferable that the substrate be subjected to surface thermal treatment at 1,000° C. in the presence or a hydrogen ($H_2$) gas (ambient gas) to remove impurities, then the substrate temperature be adjusted to 650° C., and an $Al_xGa_{1-x}N$ buffer layer be grown on the substrate.

First, the temperature of the substrate 11 was increased to 1,200° C. While supplying trimethylgallium (hereinafter referred to as TMG) and an ammonia (hereinafter referred to as $NH_3$)gas in the presence of $H_2$ (ambient gas), the underlayer 13 formed from undoped GaN and having a thickness of 100 nm was grown. In the case of homoepitaxial growth, the underlayer does not necessarily need to be provided.

(Formation of Semiconductor DBR)

Subsequently, the semiconductor multilayer film mirror 15 (semiconductor DBR) having an InAlN/GaN layered structure was grown on the underlayer 13. Its details will be described below.

(Step G2: InAlN Layer)

The temperature of the substrate 11 was adjusted from 1,200° C. to 950° C., and the carrier gas used was changed from $H_2$ to $N_2$. After the substrate temperature was stabilized, an InAlN layer with a thickness of 49 nm was grown on the underlayer 13 as the InAlN-based semiconductor film 15A while supplying trimethylindium (hereinafter referred to as TMI), trimethylaluminum (hereinafter referred to as TMA), and $NH_3$. Thereafter, the supply of the metal-organic materials (hereinafter referred to as MO materials) was stopped.

(Step G3: First GaN Layer)

Subsequently, the flow rate of the $N_2$ carrier gas was appropriately changed. While supplying triethylgallium (hereinafter referred to as TEG) and $NH_3$, the thin GaN cap layer 15B (first GaN layer) with a thickness of 4.0 nm was grown on the InAlN-based semiconductor film 15A. Thereafter, the supply of the MO material was stopped. The thin GaN cap layer 15B is provided to protect a surface of the InAlN layer. The thin GaN cap layer 153 (first GaN layer) preferably has a thickness of 1 nm to 5 nm in order to prevent the occurrence of bow or cracks.

(Step G4: AlGaN Layer)

Next, the temperature of the substrate 11 was increased from 950° C. to 1,100° C. and then stabilized. The carrier gas used was changed from $N_2$ to $H_2$. While supplying TMG, TMA, and NH$_3$, the thin AlGaN layer 15C with a thickness of 5 nm was formed on the thin GaN cap layer 15B.

(Step G5: Second GaN Layer)

Subsequently, the supply amounts of the materials were changed. While supplying TMG and NH$_3$, the GaN-based semiconductor film 15D (second GaN layer) with a thickness of 36 nm was formed on the AlGaN layer 15C. Thereafter, the supply of the MO material was stopped.

(Step G6: Layering)

A series of steps G2 to G5 was further repeated 34 times to obtain an InAlN/GaN-based semiconductor DBR (semiconductor multilayer film mirror 15) having a total of 35 pairs (one pair corresponds to a set of the InAlN-based semiconductor film 15A, the thin GaN cap layer 15B, the AlGaN layer 15C, and the GaN-based semiconductor film 15D that are sequentially layered). The In composition of the InAlN layer was adjusted to about 16.5 at %, and the Al composition of the AlGaN layer was adjusted to about 13.5 at %. The total thickness from the first GaN layer to the second GaN layer including the AlGaN layer 15C interposed therebetween is about 45 nm. In this manner, the semiconductor multilayer film mirror 15 was formed on the underlayer 13.

(Step G7: N-Type GaN Layer)

Next, the temperature of the substrate 11 was increased from 1,100° C. to 1,200° C. and then stabilized. While supplying TMG, NH$_3$, and disilane (hereinafter referred to as Si$_2$H$_6$) with a hydrogen dilute concentration of 10 ppm, an Si-doped, n-type GaN layer (first semiconductor layer 17) with a thickness of 467 nm was formed on the semiconductor multilayer film mirror (the carrier gas used was H$_2$). Thereafter, the supply of the MO material and Si$_2$H$_6$ was stopped.

(Formation of Light-Emitting Layer)

Subsequently, the light-emitting layer 20 having a multi quantum well (hereinafter referred to as MQW) structure was formed on the first semiconductor layer 17. Its barrier layer and well layer each comprise In$_x$Al$_y$Ga$_{1-x-y}$N. In the present example, GaN (x=y=0) was used in the barrier layer and InGaN (y=0) was used in the well layer.

First, the temperature of the substrate 11 was adjusted to 850° C., the substrate temperature was stabilized, and the carrier gas used was changed from H$_2$ to N$_2$.

(Step G8: Barrier Layer)

Thereafter, while supplying TEG and NH$_3$, the barrier layer (GaN) with a thickness of 6.0 nm was formed on the first semiconductor layer 17. Thereafter, the supply of the MO material was stopped.

(Step G9: Well Layer)

Next, while supplying TEG, TMI, and NH$_3$, the well layer (InGaN) with a thickness of 3.0 nm was formed on the barrier layer (GaN). Thereafter, the supply of the MO materials was stopped.

(Step G10: Layering)

A series of steps G8 and G9 was further repeated four times to obtain an MQW structure having a total of five pairs of the GaN barrier layer and the InGaN well layer.

(Step G11: Last Barrier Layer)

Next, while supplying TEG and NH$_3$, the last barrier layer with a thickness of 10.0 nm was formed to protect the InGaN well layer of the last pair. Thereafter, the supply of the MO material was stopped. In this manner, the light-emitting layer 20 was formed on the first semiconductor layer 17.

Note that a super lattice structure (hereinafter referred to as SLS) may be introduced between the n-type GaN layer (first semiconductor layer 17) and the MQW structure. The number of quantum wells in the MQW structure can be set freely by a designer, and the number of the layers is not limited to a particular number.

Furthermore, the barrier layer in the MQW structure may be subjected to n-type doping such as Si or p-type doping such as magnesium (hereinafter referred to as Mg) as needed.

(Step G12: Electronic Barrier Layer)

Next, the temperature of the substrate 11 was increased from 850° C. to 1,000° C., the substrate temperature was stabilized, and the carrier gas used was changed from N$_2$ to H$_2$. An Mg-doped p-type AlGaN layer 21 was formed as an electronic barrier layer. While supplying TMG, TMA, biscyclopentadienyl magnesium (hereinafter referred to as Cp2Mg), and NH$_3$, the p-type AlGaN layer 21 with a thickness of 20 nm was formed on the light-emitting layer 20. Thereafter, the supply of the MO materials was stopped.

(Step G13: P-Type GaN Layer)

Next, the temperature of the substrate 11 was increased from 1,000° C. to 1,100° C. and the substrate temperature was stabilized (the carrier gas used was H$_2$). While supplying TMG, Cp2Mg, and NH$_3$, an Mg-doped p-type GaN layer 23 with a thickness of 63 nm was formed on the p-type AlGaN layer 21.

(Step G14: P-Type Contact Layer)

Subsequently, using Gp2Mg instead of TMG, an Mg-doped p-type GaN contact layer 25 with a thickness of 10 nm was formed on the big-doped p-type GaN layer 23. Note that an Mg concentration in the p-type GaN layer 23 is much lower than an Mg concentration in the p-type GaN contact layer 25. Thereafter, the supply of the MO material was stopped. In this manner, the second semiconductor layer 27 having the second conductivity type (p-type) opposite to the conductivity type of the first semiconductor layer 17 was formed.

(Step G15: Temperature Lowering)

The carrier gas used was changed from H$_2$ to N$_2$. While continuously supplying NH$_3$, the temperature of the substrate 11 was slowly lowered from 1,100° C. to the room temperature. After the temperature fall, the grown wafer was taken out.

In the semiconductor layered structure of Example 1, at a wavelength of 445 nm, a region from the center of the well layer in the third pair at this point in time to the last GaN layer (the AlGaN layer 15C and the GaN-based semiconductor film 15D (second GaN layer)) in the semiconductor multilayer film mirror 15 corresponds to 3.0 wavelengths. A region from that center to the p-type contact layer corresponds to 0.7 wavelengths. Thus, the thickness from the last GaN layer is the semiconductor multilayer film mirror 15 to the p-type contact layer corresponds to 3.7 wavelengths. The reason for this is to use the remaining 0.3 wavelengths by the transparent electrode and the first layer in the dielectric multilayer film mirror to be described below.

(Step of Producing Elements)

FIGS. 3 to 11 are partial cross-sectional views of the aforementioned grown wafer illustrating the process steps of the semiconductor light-emitting element of Example 1. The process of producing elements is not limited thereto. A flip-chip structure or an arrayed structure may be employed instead.

(Step P1: Activation Treatment)

Figure 3:
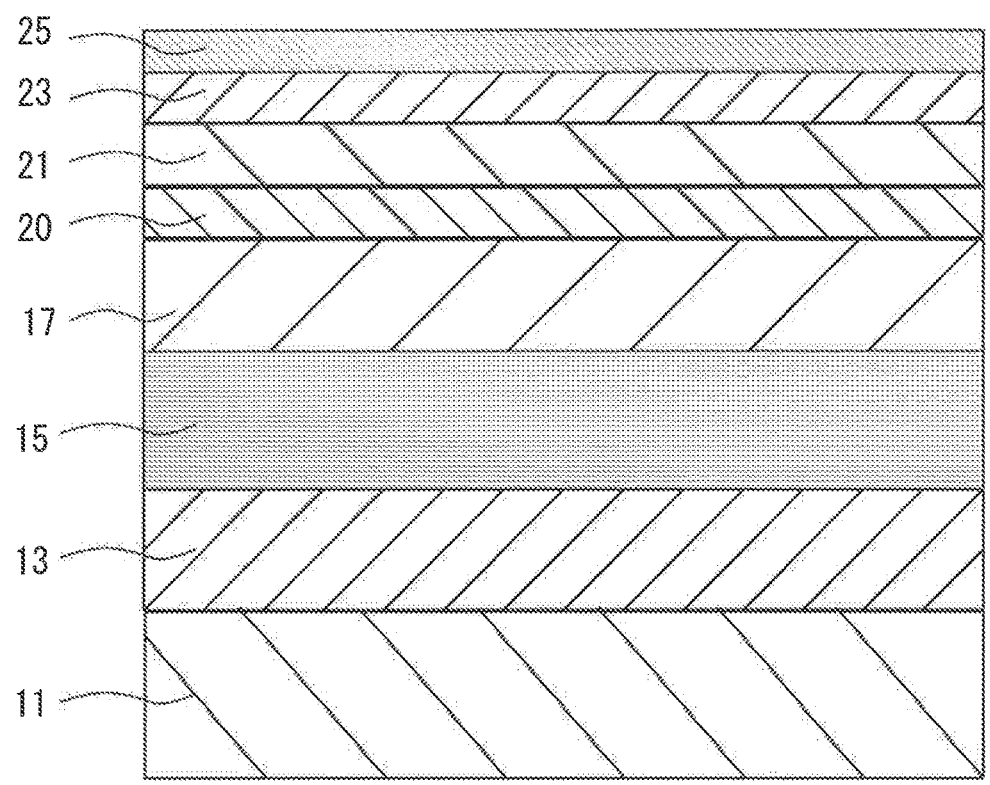
FIG. 3 is a partial cross-sectional view of a grown wafer illustrating a process step of a semiconductor light-emitting element according to Example 1 of the present invention.
Figure 4:
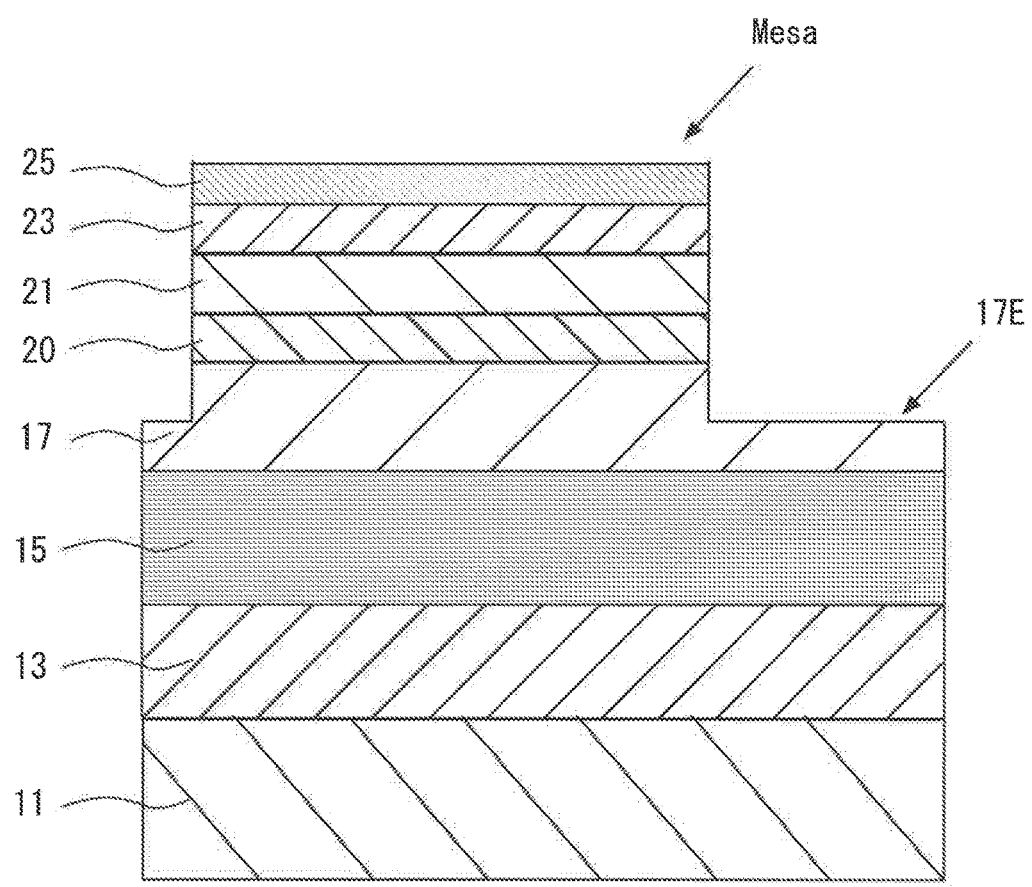
FIG. 4 is a partial cross-sectional view of the grown wafer illustrating a process step of the semiconductor light-emitting element according to Example 1 of the present invention.

After being subjected to organic cleaning, the aforementioned grown wafer was subjected to thermal treatment in a rapid thermal annealing (hereinafter referred to as RTA) device to cause hydrogen desorption in the p-type layers (the second semiconductor layer 27: the p-type AlGaN layer 21, the p-type GaN layer 23, and the p-type GaN contact layer 25) shown in FIG. 3 and thereby activate Mg, which is a p-type dopant.

(Step P2: Mesa Structure)

The grown wafer was again subjected to the organic cleaning, and then a mesa pattern was formed with a photoresist. While forming a mesa structure Mesa shown in FIG. 4 by dry etching, an exposed portion 17E in which the first semiconductor layer 17 was partially exposed was formed around the mesa structure. Thereafter, the photoresist was removed.

(Step P3: Formation of Insulating Film and Exit Aperture)

Figure 5:
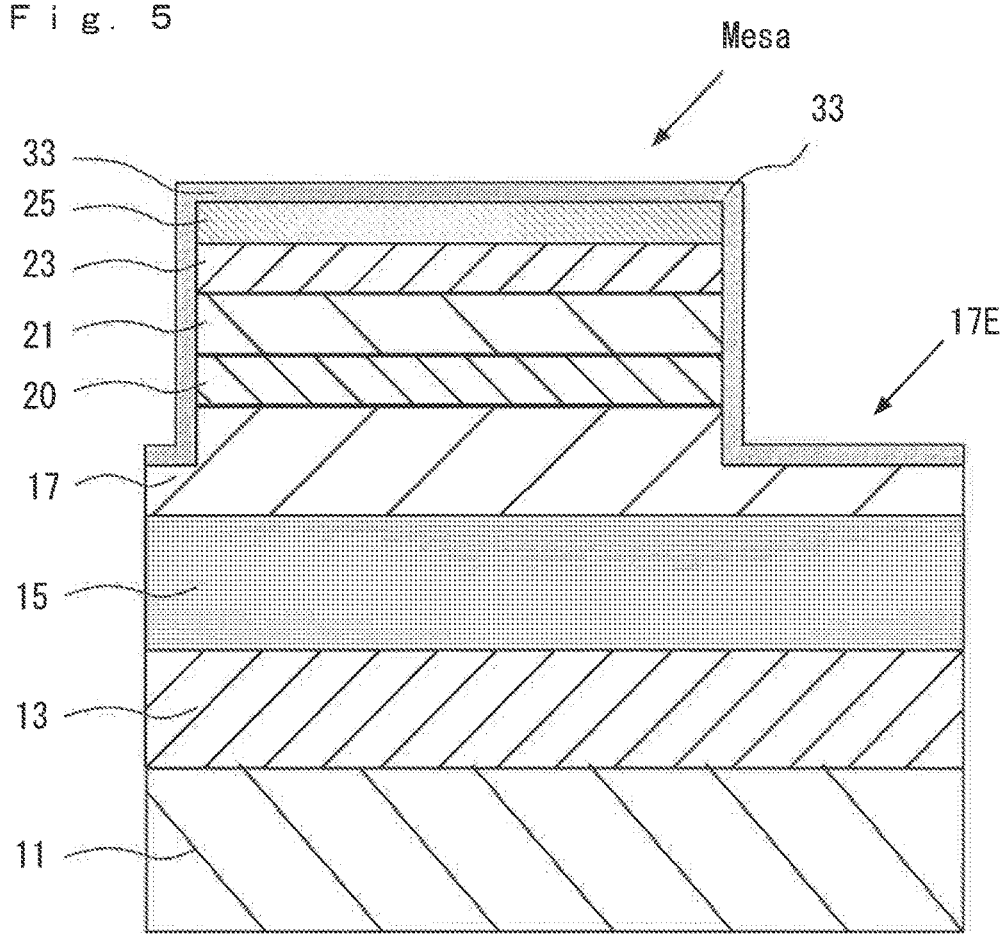
FIG. 5 is a partial cross-sectional view of the grown wafer illustrating a process step of the semiconductor light-emitting element according to Example 1 of the present invention.
Figure 6:
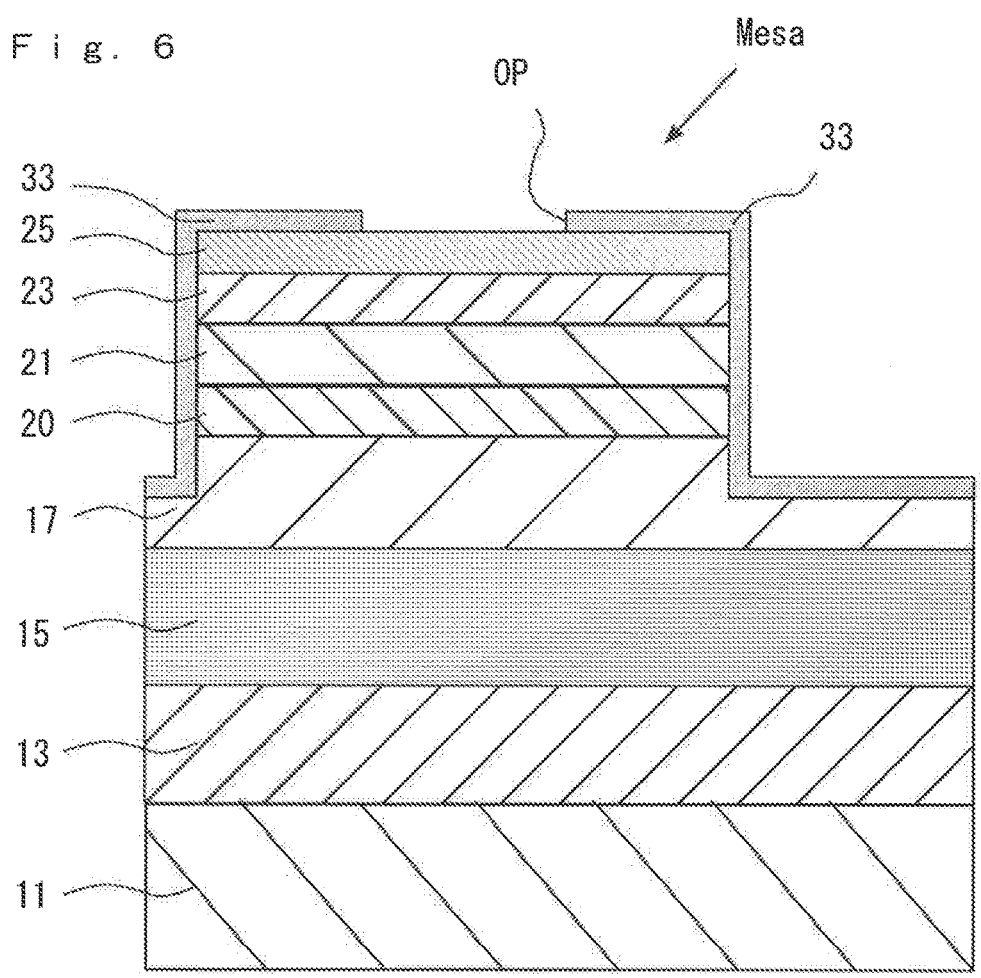
FIG. 6 is a partial cross-sectional view of the grown wafer illustrating a process step of the semiconductor light-emitting element according to Example 1 of the present invention.

The grown wafer was again subjected to the organic cleaning, and then the insulating film 33 with a thickness of 150 nm was formed on the mesa structure Mesa and the exposed portion 17E by sputtering as shown in FIG. 5. Silicon oxide (hereinafter referred to as $SiO_2$) was used in the insulating film 33. After the grown wafer was again subjected to the organic cleaning, a pattern was formed with a photoresist. The grown wafer was subjected to etching treatment with buffered hydrofluoric acid (hereinafter referred to as BHF) to form the light exit opening OP in the insulating film 3 on the mesa, structure Mesa as shown in FIG. 6. Thereafter, the photoresist was removed.

(Step P4: P-Electrode (Ohmic Layer))

Figure 7:
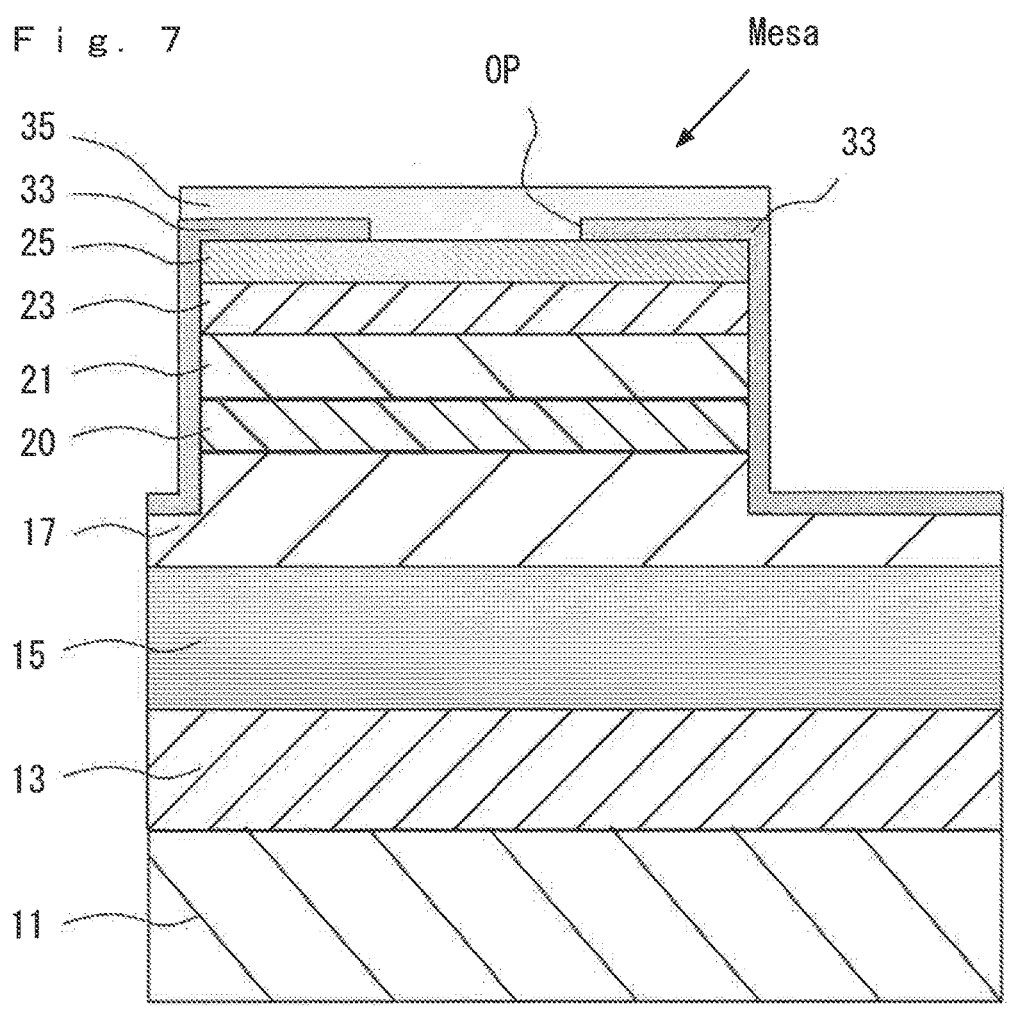
FIG. 7 is a partial cross-sectional view of the grown wafer illustrating a process step of the semiconductor light-emitting element according to Example 1 of the present invention.

After being subjected to the organic cleaning again, the grown wafer was subjected to pretreatment with ammonia water. After the grown wafer was cleaned with pure water and then dried, a p-ohmic layer with a thickness of about 18 nm was formed by sputtering. Indium tin oxide (hereinafter referred to as ITO) was used in the p-ohmic layer. After the grown wafer was again subjected to the organic cleaning, a pattern was formed with a photoresist. The grown wafer was subjected to etching treatment with a mixed acid ITO solution to form an ITO pattern on the insulating film 33 on the mesa structure Mesa and the p-type GaN contact layer 25 exposed through the opening OP as shown in FIG. 7. Thereafter, the photoresist was removed. The grown wafer was subjected to thermal treatment by RTA to make the ITO transparent and improve the conductive property of the ITO. In this manner, the transparent electrode 35 was formed.

(Step P5: P-Electrode (Metal Layer))

Figure 8:
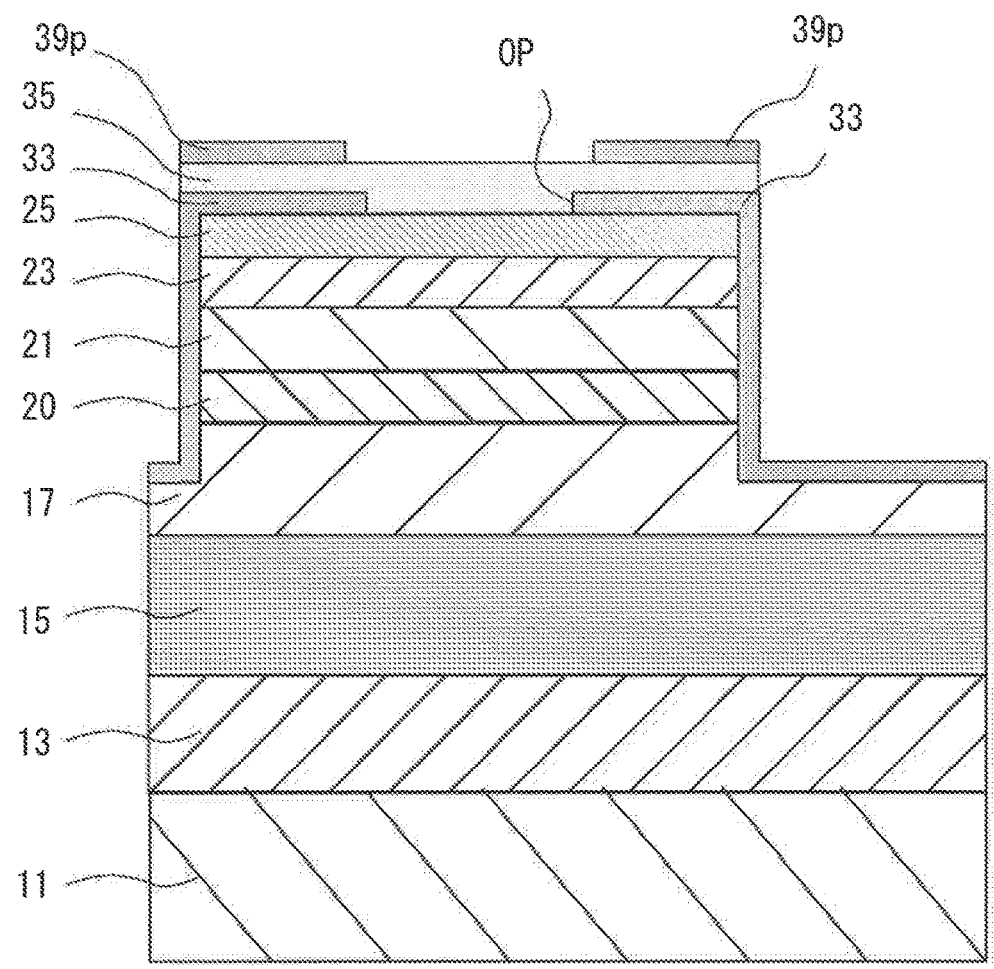
FIG. 8 is a partial cross-sectional view of the grown wafer illustrating a process step of the semiconductor light-emitting element according to Example 1 of the present invention.

After the grown wafer was again subjected to the organic cleaning, a pattern was formed with a photoresist. The grown wafer was cleaned with pure water and then dried. Next, a p-metal layer (p-electrode 39p) with a thickness of about 300 nm was formed on the transparent electrode 35 without covering the opening OP by electron beam (hereinafter referred to as EB) evaporation as shown in FIG. 8. A layered product of platinum (hereinafter referred to as Pt), gold (hereinafter referred to as Au), and titanium (hereinafter referred to as Ti) was used as the p-metal layer. Next, the photoresist was removed after being lifted off with a chemical.

(Step P6: N-Electrode)

Figure 9:
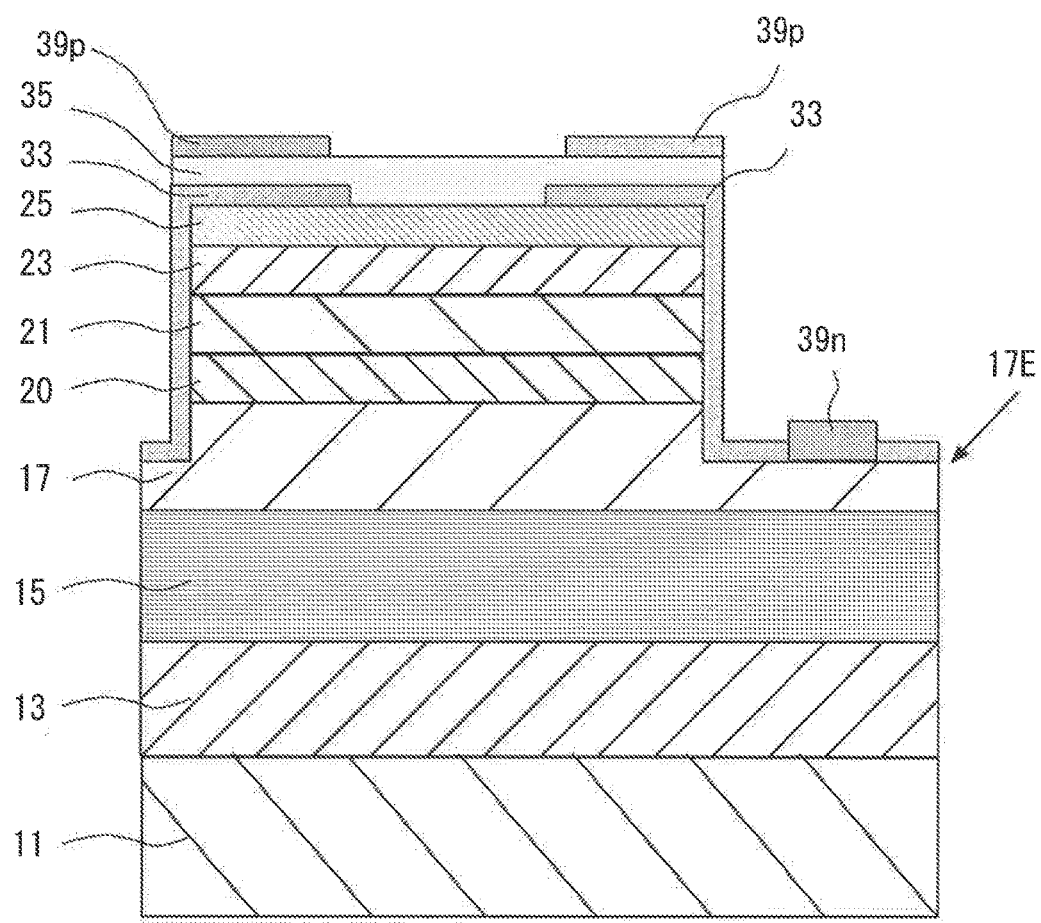

After the grown wafer was again subjected to the organic cleaning, an n-electrode pattern was formed with a photoresist. The grown wafer was cleaned with pure water and then dried. Next, the n-electrode 39n electrically connected to the exposed portion 17E of the first semiconductor layer 17 and having a thickness of about 600 nm was formed by the EB evaporation as shown in FIG. 9. A layered product of Ti, Al, Pt, and Au was used as the n-electrode 39n. Next, the photoresist was removed after being lifted off with a chemical.

(Step P7: Dielectric Multilayer Film Mirror)

Figure 10:
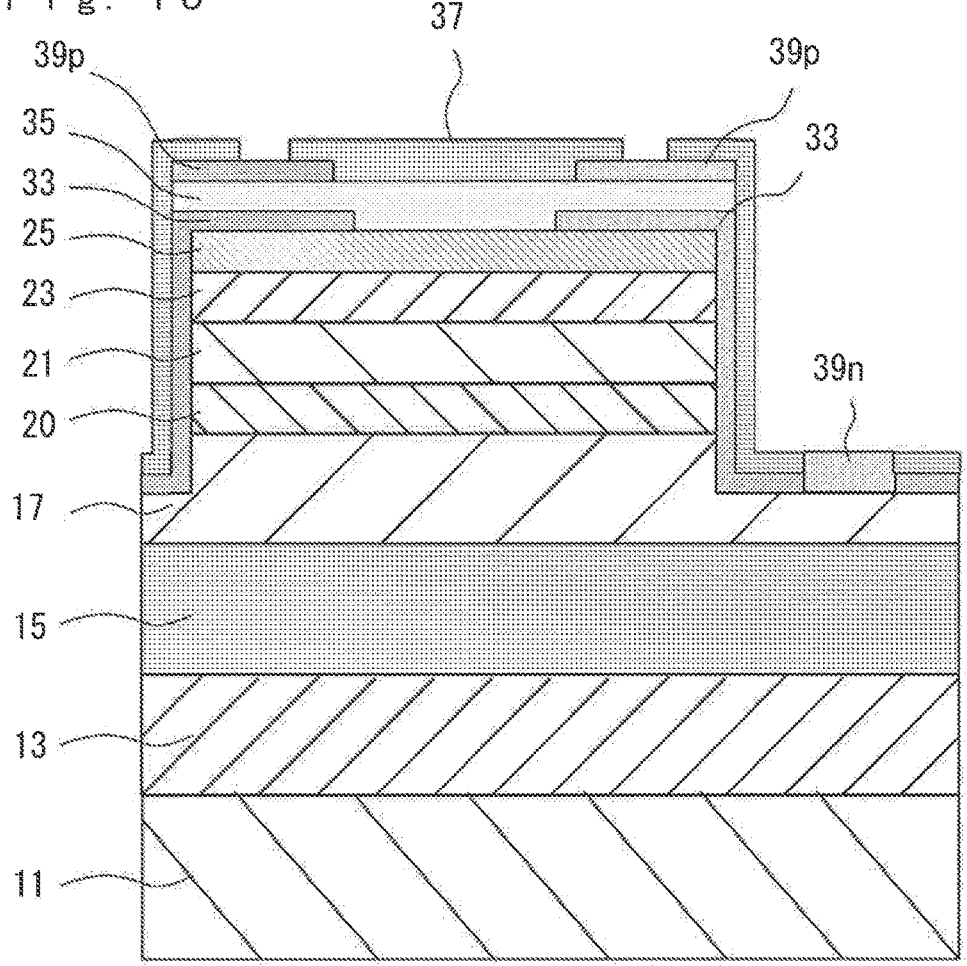
FIG. 10 is a partial cross-sectional view of the grown wafer illustrating a process step of the semiconductor light-emitting element according to Example 1 of the present invention.

The grown wafer was again subjected to the organic cleaning, and then dried. Next, the p-dielectric multilayer film mirror 37 was formed on the transparent electrode 35 by the EB evaporation as shown in FIG. 10. A layered product of niobium oxide (hereinafter referred to as $Nb_2O_5$) and $SiO_2$ was used as the dielectric multilayer film mirror 37. Next, the pattern of the dielectric multilayer film mirror 37 was formed with a photoresist. The grown wafer was cleaned with pure water and then dried. Next, unnecessary portions (portions on the p-electrode 39p and on the n-electrode 39n) of the dielectric multilayer film mirror 37 were removed by etching in a dry etching device. Finally, the photoresist was removed with a chemical. Note that the length of the cavity may be adjusted by inserting an ITO film, for example, before the dielectric multilayer film mirror 37 is formed. The thickness of the first $Nb_2O_5$ layer is about 35.7 nm, and thus occupies, together with about 18 nm of the ITO ohmic layer, 0.3 wavelengths for a wavelength of 445 nm.

(Step S8: P-Electrode (Another Metal Layer))

Figure 11:
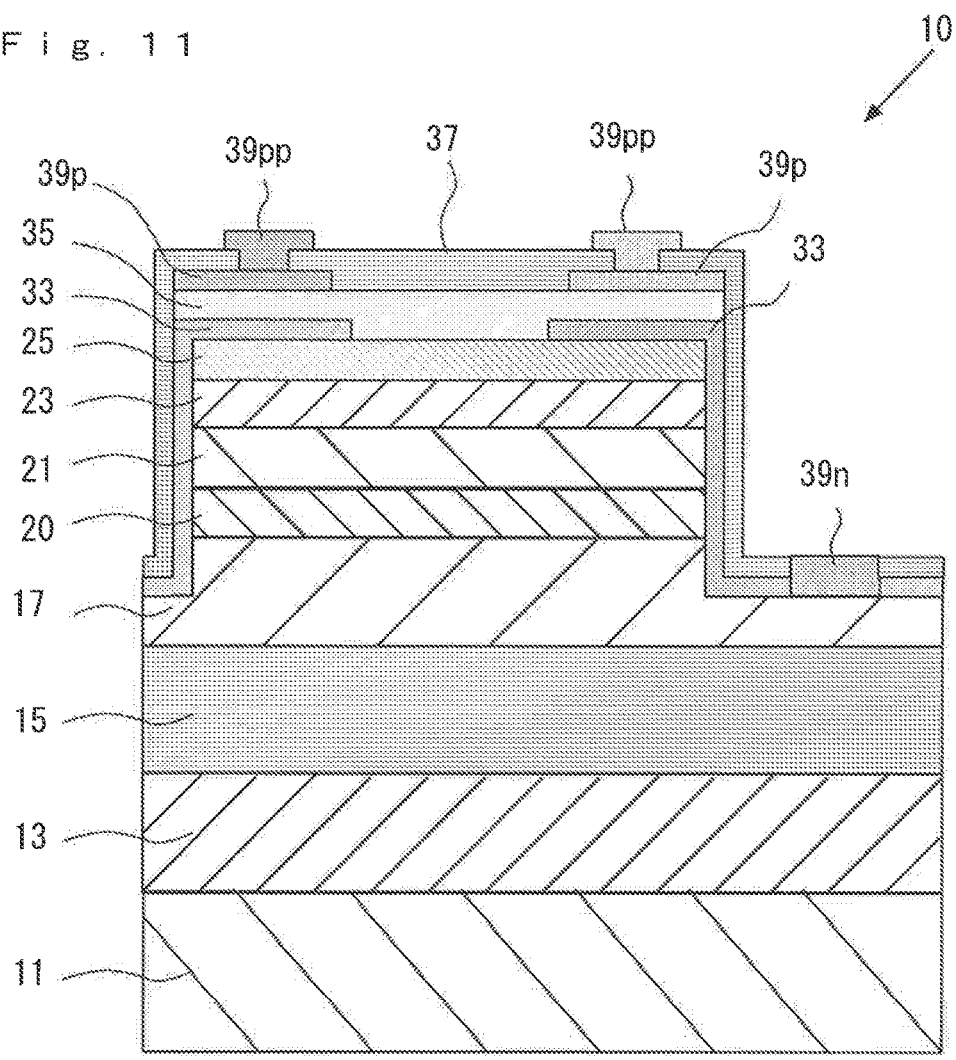
FIG. 11 is a partial cross-sectional view of the grown wafer illustrating a process step of the semiconductor light-emitting element according to Example 1 of the present invention.

After the grown wafer was again subjected to the organic cleaning, a pattern was formed with a photoresist. The grown wafer was cleaned with pure water and then dried. Next, another p-metal layer (p-electrode 39pp) electrically connected to the p-electrode 39p and having a thickness of about 1,150 nm was formed by the EB evaporation as shown in FIG. 11. A layered product of Pt, Au, and Ti was used as the p-electrode 39pp. Next, the photoresist was removed after being lifted off with a chemical.

Example 2

In Example 2, a VCSEL element the same as that of Example 1 was manufactured except that the thin AlGaN layer 15C was formed by controlling the flow rate of TMA to set the Al composition to about 16 at % in the step G4 for the AlGaN layer.

Example 3

In Example 3, a VCSEL element the same as that of Example 1 was manufactured except that the thin AlGaN layer 15C was formed by controlling the flow rate of TMA during the growth of AlGaN to have graded Al composition from about 18 at % to about 14 at % in the step G4 for the AlGaN layer.

Example 4

In Example 4, a VCSEL element the same as that of Example 1 was manufactured except that the AlGaN layer 15C had a two-layer structure in the step G4 for the AlGaN layer. The first AlGaN layer from the substrate side wets grown by controlling the flow rate of TMA to have Al composition of about 14 at % and a thickness of 3.0 nm.

Subsequently, the second AlGaN layer was grown to have a thickness of 2.0 nm by controlling the flow rate of TMA during the growth thereof to change the Al composition from 14 at % to 0 at %.

Example 5

In Example 5, a VCSEL element the same as that of Example 1 was manufactured except that the AlGaN layer 15C had a two-layer structure, the first AlGaN layer from the substrate side was grown to have a thickness of 2.0 nm by controlling the flow rate of TMA during the growth thereof to have graded Al composition from 14 at % to 18 at %, and subsequently the second AlGaN layer was grown to have a thickness of 3.0 nm by controlling the flow rate of TMA to have the In composition of about 18 at % in the step G4 for the AlGaN layer.

Comparative Example 1

In Comparative Example 1, a VCSEL element the same as that of Example 1 was manufactured except that no step G4 for the AlGaN layer was performed (no AlGaN layer 15C was inserted) as conventional conditions, and the GaN-based semiconductor film 15D (the second GaN layer) according to the step G5 for the second GaN layer was provided on the thin GaN cap layer 15B according to the step G3 for the first GaN layer to have a thickness of about 44.6 nm.

(Measurements, Analyses, and Evaluations)

Surfaces of the semiconductor multilayer film mirrors 15 obtained by the step G6 for layering in Examples and Comparative Example were subjected to atomic force microscope (ATM) measurements. Dislocation densities and surface flatness thereof were compared to one another. The results of the obtained dislocation densities and surface flatness are shown in FIG. 12.

Reflectivities of the semiconductor multilayer film mirrors 15 obtained by the step G6 for layering in Example 1 and Comparative Example 1 were measured and compared to each other.

(Results, Theory, and Effects)

In the semiconductor multilayer film mirror 15 of Example 1 shown in FIG. 12, it can be seen that the effects of reducing the dislocation density and improving the surface flatness can be obtained when the Al composition is in a range of about 13.5 to 18 at %. Even in a single layer having fixed Al composition, it was confirmed that the effects of reducing the dislocation density and improving the surface flatness can be obtained in a range of 13.5 to 16 at %. Moreover, it was confirmed that graded Al composition can yield such effects. Furthermore, even when the AlGaN layer 15C has a two-layer structure and one layer of the two-layer structure closer to the GaN-based semiconductor film 15D has the Al composition graded in a decreasing manner, it was confirmed that the effects of reducing the dislocation density and improving the surface flatness were the highest if the other layer of the two-layer structure closer to the InAlN-based semiconductor film 16A has the Al composition graded in an increasing manner. Any of Examples has the AlGaN layer 15C having the Al composition of 13.5 at % or more and having a thickness of 3 nm or more.

The above-described results are organized in FIG. 12, and results according to the following judgement criteria are listed together.

With regard to a dislocation density (number/cm$^2$), which is the number of dislocation defects on a surface of a semiconductor multilayer film mirror in an AFM image, a dislocation density smaller than 5.0E+6 (hereinafter, 5.0× 10$^6$ is written as 5.0E+6)/cm$^2$ is defined as "excellent" and denoted by "A." A dislocation density larger than or equal to 5.0E+6/cm$^2$ and smaller than 1.0E+7/cm$^2$ is defined as "good" and denoted by "B." A dislocation density larger than or equal to 1.0E+7/cm$^2$ is defined as "failing" and denoted by "D."

With regard to flatness (nm) of a surface of a semiconductor multilayer film mirror in an AFM image, a peak-to-peak average distance smaller than 4 nm in a Z-axis direction in an AFM image of 100 μm square (Zp-p@AFM100 μm square) is defined as "excellent" and denoted by "A." A peak-to-peak average distance larger than or equal to 4 nm and smaller than 6 nm is defined as "good" and denoted by "B." A peak-to-peak average distance larger than or equal to 6 nm and smaller than 8 nm is defined as "fair" and denoted by "C." A peak-to-peak average distance larger than or equal to 8 nm is defined as "failing" and denoted by "D."

Based on the combinations of the above judgements, the overall judgements are as shown in Table 1 below.

TABLE 1

| COMBINATION OF JUDGEMENTS | | |
|---|---|---|
| FLATNESS | DISLOCATION DENSITY | OVERALL JUDGEMENT |
| A | A | A |
| A | B | B |
| A | B | B |
| A | D | D |
| B | B | B |
| B | D | D |
| C | D | D |
| D | D | D |

From the above results, in the case of the single-film AlGaN layer 15C, the Al composition of 13.5 at % or store and 16 at % or less is preferred. In the case of the two-layered AlGaN layer 15C, the dislocation density and the flatness are both good when composition fixed portions having the Al composition of 13.5 at % and 18 at % are provided to have a thickness of at least 3 nm. Thus, by introducing the AlGaN layer 15C having a thickness of at least 3 nm or more and having the Al composition of 13.5 at % or more and 18 at % or less, the InAlN/GaN-based DBR (semiconductor multilayer film mirror 15) achieving both a low dislocation density and a high level of flatness can be obtained. Moreover, an optimal structure for the InAlN/GaN-based DBR can be further obtained by appropriately designing the graded composition or making the AlGaN layer by a plurality of layers.

The InAlN layer of the InAlN-based semiconductor film 15A and GaN have approximately the same a (=b)-axis length, i.e., are lattice-matched with each other when the InAlN layer has the In composition of about 18 at %. Lower In composition increases a refractive index difference with GaN. While this is advantageous in improving the reflectance characteristics of the semiconductor multilayer film mirror 15, an amount of lattice mismatch is also increased. The lattice mismatch causes cracks or dislocation. For example, the In composition of the InAlN layer in the InAlN-based semiconductor film 15A used in the present invention is about 16.5 at %. In this case, the a-axis length is about 0.3179 nm. The a-axis length for the In composition of 18 at %, on the other hand, is 0.3185 nm. Mismatch amounts with respect to an a-axis length of 0.31891 nm in GaN are about 0.32% and about 0.13%, respectively, resulting in a difference more than double. While it is ideal to make layering with an In composition capable of achieving lattice match, a refractive index difference between the InAlN layer of the InAlN-based semiconductor film 15A and GaN in such a case is small. As a result, surface roughness or increase in dislocation density due to larger In composition becomes a concern in addition to failing to improve the reflectance characteristics of the semiconductor multilayer film mirror 15. In view of this, it is desired to eliminate lattice mismatch while using an InAlN layer having an In composition at the lowest level possible.

In the AlGaN layer 15C, as the Al composition is increased, the a-axis length is reduced and thus an amount of lattice mismatch with GaN is increased.

When the AlGaN layer 15C has the Al composition of about 13 to 14 at %, the a-axis length is 0.3173 nm, i.e., close to the a-axis length when the InAlN layer of the InAlN-based semiconductor film 15A has the In composition of 16.5 at %. Thus, on the basis of an idea that the Al composition of the AlGaN layer 15C is controlled so as to take the middle between the a-axis lengths of GaN and the InAlN layer of the InAlN-based semiconductor film 15A, the AlGaN layer 15C having the Al composition of 14 at % was inserted as in Example 1. As a result, there was no significant change in crack amount, and the dislocation density and the flatness were significantly improved. With the inclusion of Examples 3 and 5, such advantageous effects can be obtained for the In composition of up to 18 at %. Thus, with respect to $In_{0.165}Al_{0.835}N$ in the InAlN-based based semiconductor film 15A, for example, the Al composition of the AlGaN layer 15C may be set so at least 14 to 18 at %. In this case, a lattice mismatch rate between the InAlN layer of the InAlN-based semiconductor film 15A and the AlGaN layer 15C is 0 to 0.12%, and a lattice mismatch rate between the AlGaN layer 150 and GaN is 0.31 to 0.43%. Based on these results, it can be considered that the dislocation density and the flatness are influenced by the lattice mismatch rate between the InAlN layer and the layer provided thereon. When the In composition of the InAlN layer in the InAlN-based semiconductor film 15A is further changed, the Al composition of the AlGaN layer 150 may be adjusted so as to fall within the above lattice mismatch rates. When the lattice mismatch rate with GaN becomes large, however, the composition of the AlGaN layer 15C may be graded or the AlGaN layer 150 may have a plurality of layers such as a two-layer structure as described above.

It can be considered that the present invention has been made at least as a result of a good balance, found out by eager experiments, among improvement in crystallizability by lowering the In composition of the InAlN layer in the InAlN-based semiconductor film 13A, lattice mismatch amount, and differences in thermal expansion coefficients of the layers (the InAlN-based semiconductor film 15A, the AlGaN layer 15C, and the first and second GaN layers 15B and 15D) at crystal growth temperature and room temperature.

This application is based on a Japanese Patent Application No. 2016-241159 which is hereby incorporated by reference.

What is claimed is:

1. A semiconductor multilayer film mirror comprising:
a plurality of pairs of an InAlN-based semiconductor film and a GaN-based semiconductor film, where each pair of the InAlN-based semiconductor film and the GaN-based semiconductor film is layered in a cyclic fashion, the InAlN-based semiconductor film having an In composition of less than 18 at %; and
a thin GaN cap layer formed on the InAlN-based semiconductor film and an AlGaN layer formed on the thin GaN cap layer, between each pair of the InAlN-based semiconductor film and the GaN-based semiconductor film.

2. The semiconductor multilayer film mirror according to claim 1, wherein the AlGaN layer has an Al composition satisfying at least a lattice mismatch rate of 0.12% or less with the InAlN-based semiconductor film.

3. The semiconductor multilayer film mirror according to claim 1, wherein the AlGaN layer has a thickness of at least 3 nm or more.

4. The semiconductor multilayer film mirror according to claim 1, wherein the AlGaN layer has a graded Al composition.

5. The semiconductor multilayer film mirror according to claim 1, wherein the AlGaN layer has a layered structure having two or more layers.

6. The semiconductor multilayer film mirror according to claim 1, wherein the thin GaN cap layer has a thickness of 1 nm or more and 5 nm or less.

7. A vertical cavity type light-emitting element comprising:
a semiconductor multilayer film mirror as a first reflecting mirror comprising: a plurality of pairs of an InAlN-based semiconductor film and a GaN-based semiconductor film, where each pair of the InAlN-based semiconductor film and the GaN-based semiconductor film is layered in a cyclic fashion, the InAlN-based semiconductor film having an In composition of less than 18 at %; and a thin GaN cap layer formed on the InAlN-based semiconductor film and an AlGaN layer formed on the thin GaN cap layer, between each pair of the InAlN-based semiconductor film and the GaN-based semiconductor film;
a first semiconductor layer formed of at least one semiconductor layer on the first reflecting mirror;
an active layer formed on the first semiconductor layer;
a second semiconductor layer formed on the active layer and including at least one semiconductor layer having a conductivity type opposite to that of the first semiconductor layer; and
a second reflecting mirror disposed on the second semiconductor layer so as to be opposed to the first reflecting mirror.

8. The vertical cavity type light-emitting element according to claim 7, wherein the AlGaN layer has an Al composition satisfying at least a lattice mismatch rate of 0.12% or less with the InAlN-based semiconductor film.

9. The vertical cavity type light-emitting element according to claim 7, wherein the AlGaN layer has a thickness of at least 3 nm or more.

10. The vertical cavity type light-emitting element according to claim 7, wherein the AlGaN layer has a graded Al composition.

11. The vertical cavity type light-emitting element according to claim 7, wherein the AlGaN layer has a layered structure having two or more layers.

12. The vertical cavity type light-emitting element according to claim 7, wherein the thin GaN cap layer has a thickness of 1 nm or more and 5 nm or less.

13. A method for manufacturing a semiconductor multilayer film mirror by atmospheric pressure metal-organic vapor phase epitaxy, the method comprising:
a layering step of layering a pair of an InAlN-based semiconductor film and a GaN-based semiconductor film a plurality of times in a cyclic fashion, wherein the layering step includes:
a step of growing the InAlN-based semiconductor film so that the InAlN-based semiconductor film has an In composition of less than 18 at %;
a step of forming a thin GaN cap layer after the step of growing the InAlN-based semiconductor film;
a step of growing an AlGaN layer after the step of growing the thin GaN cap layer; and a step of growing the GaN-based semiconductor film after the step of growing the AlGaN layer.

14. A method for manufacturing a vertical cavity type light-emitting element by atmospheric pressure metal-organic vapor phase epitaxy, the method comprising:
   a step of forming a semiconductor multilayer film mirror under atmospheric pressure, as a first reflecting mirror, comprising: a layering step of layering a pair of an InAlN-based semiconductor film and a GaN-based semiconductor film a plurality of times in a cyclic fashion, wherein the layering step includes:
      a step of growing the InAlN-based semiconductor film so that the InAlN-based semiconductor film has an In composition of less than 18 at %;
      a step of forming a thin GaN cap layer after the step of growing the InAlN-based semiconductor film;
      a step of growing an AlGaN layer after the step of growing the thin GaN cap layer; and
   a step of growing the GaN-based semiconductor film after the step of growing the AlGaN layer;
   a step of forming a first semiconductor layer formed of at least one semiconductor layer on the first reflecting mirror;
   a step of forming an active layer on the first semiconductor layer;
   a step of forming a second semiconductor layer, including at least one semiconductor layer having a conductivity type opposite to that of the first semiconductor layer, on the active layer; and
   a step of forming a second reflecting mirror on the second semiconductor layer so as to be opposed to the semiconductor multilayer film mirror.

* * * * *